United States Patent [19]
Okada

[11] Patent Number: 5,426,763
[45] Date of Patent: Jun. 20, 1995

[54] MEMORY CARTRIDGE INCLUDING A KEY DETECTOR FOR INHIBITING MEMORY ACCESS AND PREVENTING UNDESIRABLE WRITE OPERATIONS

[75] Inventor: Satoru Okada, Kyoto, Japan

[73] Assignee: Nintendo Co., Ltd., Kyoto, Japan

[21] Appl. No.: 63,774

[22] Filed: May 20, 1993

Related U.S. Application Data

[63] Continuation of Ser. No. 623,645, Dec. 18, 1990, abandoned.

[30] Foreign Application Priority Data

Apr. 20, 1989 [JP] Japan .................................. 1-101026
Apr. 19, 1990 [WO] WIPO .................. PCT/JP90/00511

[51] Int. Cl.$^6$ ...................... G06F 12/16; G11C 7/00; A63F 9/24
[52] U.S. Cl. ..................... 395/425; 395/575; 395/750; 365/52; 365/228; 365/195; 364/DIG. 1; 273/435
[58] Field of Search ................. 365/52, 228, 229, 195; 395/425, 575, 750; 380/3, 4; 273/435

[56] References Cited
U.S. PATENT DOCUMENTS

| | | | |
|---|---|---|---|
| 4,332,009 | 5/1982 | Gerson | 395/425 |
| 4,462,076 | 7/1984 | Smith, III | 395/100 |
| 4,799,635 | 1/1989 | Nakagawa | 395/425 |
| 4,800,533 | 1/1989 | Arakawa | 365/228 |
| 4,865,321 | 9/1989 | Nakagawa et al. | 273/85 G |
| 4,916,662 | 4/1990 | Mizuta | 365/228 |
| 5,014,982 | 5/1991 | Okada et al. | 273/435 |
| 5,095,798 | 3/1992 | Okada et al. | 273/435 |

FOREIGN PATENT DOCUMENTS

| | | |
|---|---|---|
| 0109504 | 5/1984 | European Pat. Off. |
| 0268419 | 5/1988 | European Pat. Off. |
| 0276450 | 8/1988 | European Pat. Off. |
| 55-130000 | 10/1980 | Japan |
| 62-117650 | 7/1987 | Japan |
| 62-271031 | 11/1987 | Japan |
| 8200535 | 2/1982 | WIPO |

Primary Examiner—Glenn Gossage
Attorney, Agent, or Firm—Nixon & Vanderhye

[57] ABSTRACT

A memory cartridge which may be loaded in an attachable/detachable manner to a data processing apparatus, such as a hand-held electronic game machine having a central processing unit (CPU), includes logic control circuitry, a program read only memory (ROM), a bank changing circuit, and external random access memory (RAM). The external RAM is backed-up by a battery. First key data and second key data are initially stored in the program ROM. After a power source of the data processing apparatus is turned-on and a power source voltage reaches a predetermined value, a reset signal is provided to the memory cartridge to enable circuits on the memory cartridge. When the first key data is read from the program ROM and the reset signal is detected, the external RAM may be accessed by the CPU to read and write information from/into the external RAM. When the second key data is read from the program ROM, the CPU is inhibited from such access to the external RAM.

18 Claims, 5 Drawing Sheets

MEMORY CARTRIDGE INCLUDING A KEY DETECTOR FOR INHIBITING MEMORY ACCESS AND PREVENTING UNDESIRABLE WRITE OPERATIONS

This is a continuation of application Ser. No. 07/623,645, filed Dec. 18, 1990, now abandoned.

FIELD OF THE ART

The present invention relates to a memory cartridge. More specifically, the present invention relates to a memory cartridge which is loaded in an attachable/detachable manner into a data processing apparatus.

PRIOR ART

For example, in Japanese Patent Publication (Kokai) No. 63-245535 laid open on Oct. 12, 1988, a memory cartridge which is attachable to or detachable from a data processing apparatus such as a home video game machine is disclosed. In this prior art, a memory cartridge is provided with a random access memory (RAM), and the RAM is backed-up by a battery.

Figure 7:
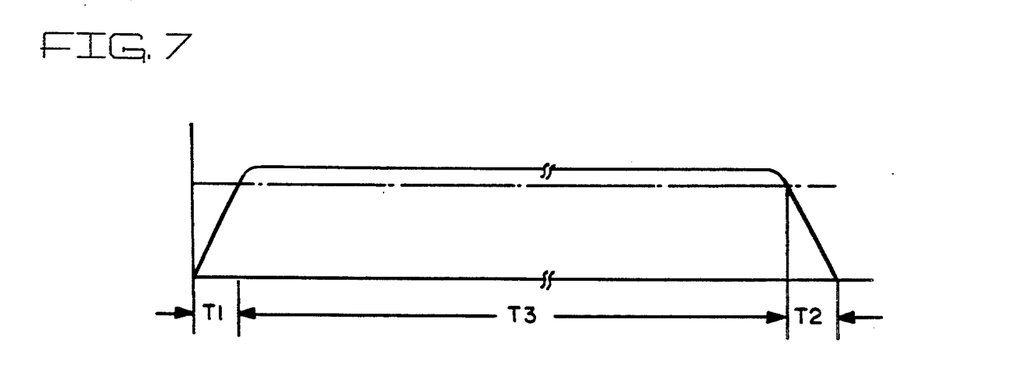
FIG. 7 is an illustrative view showing a state of a power source voltage of a main unit of a data processing apparatus.

In an external memory cartridge having a RAM, if data is written in the RAM during an unstable voltage period T1 or T2 as shown in FIG. 7, the data is occasionally destroyed. Since a power-on (or power-off) reset is normally effected in the data processing apparatus during the period T1 or T2, it is impossible to access the RAM in the external memory cartridge (hereinafter referred to as simply the external RAM). If reset occurs during a time period when the power-on and the unstable voltage period T1 (or T2) shown in FIG. 7 deviate from each other, the external RAM may be accessed in the unstable voltage period T1 or T2. When the power supplied to the data processing apparatus exceeds a given level, a reset state is released so that it becomes possible to access the external RAM. However, that power source voltage is not always sufficient for a normal operation when the reset state is released. If a write operation occurs at this time to the external RAM, the data to be written is destroyed.

As a method for solving such a problem, there is a method in which a power source voltage of the data processing apparatus is strictly watched and a power-on (power-off) reset is released only when the power source voltage becomes a voltage level sufficient for normal, stable operation. However, such a power source voltage watching circuit requires additional components increases the cost of the whole system.

SUMMARY OF THE INVENTION

Therefore, a principal object of the present invention is to provide a memory cartridge in which it is possible to prevent data from being undesirably written to or read from an external RAM with a simple scheme.

The present invention is directed to a memory cartridge which can be loaded into a data processing apparatus in an attachable/detachable manner and which includes an external RAM; a program read only memory (ROM) programmed in advance so as to generate first key data representing that the external RAM is accessible; holding means for holding the first key data read from the program ROM; and control means for enabling the external RAM in response to a selection signal from the data processing apparatus when the first key data is held by the holding means.

The data read from the program ROM is held in the holding means. When the data is other than the first key data, the control means does not permit access to the external RAM by the data processing apparatus. Then, when the data held in the holding means is the first key data, in response to the selection signal from the data processing apparatus, the selection signal is applied to the external RAM by the controlling means, whereby the external RAM becomes accessible.

In accordance with the present invention, since the external RAM can be accessed by the data processing apparatus only when the first key data is read from the program ROM, it is possible to prevent the data from being undesirably written to or read from the external RAM. More specifically, the probability is very small that a step for reading the key data from the program ROM is executed in a state where a power source voltage is astable, and as a result, the external RAM is selected and becomes accessible only at times when the power source voltage is stable.

These and other objects, features, aspects and advantages of the present invention will become more apparent from the following detailed description of the embodiments of the present invention when taken in conjunction with the accompanying drawings.

DETAILED DESCRIPTION OF THE DRAWINGS

Figure 2:
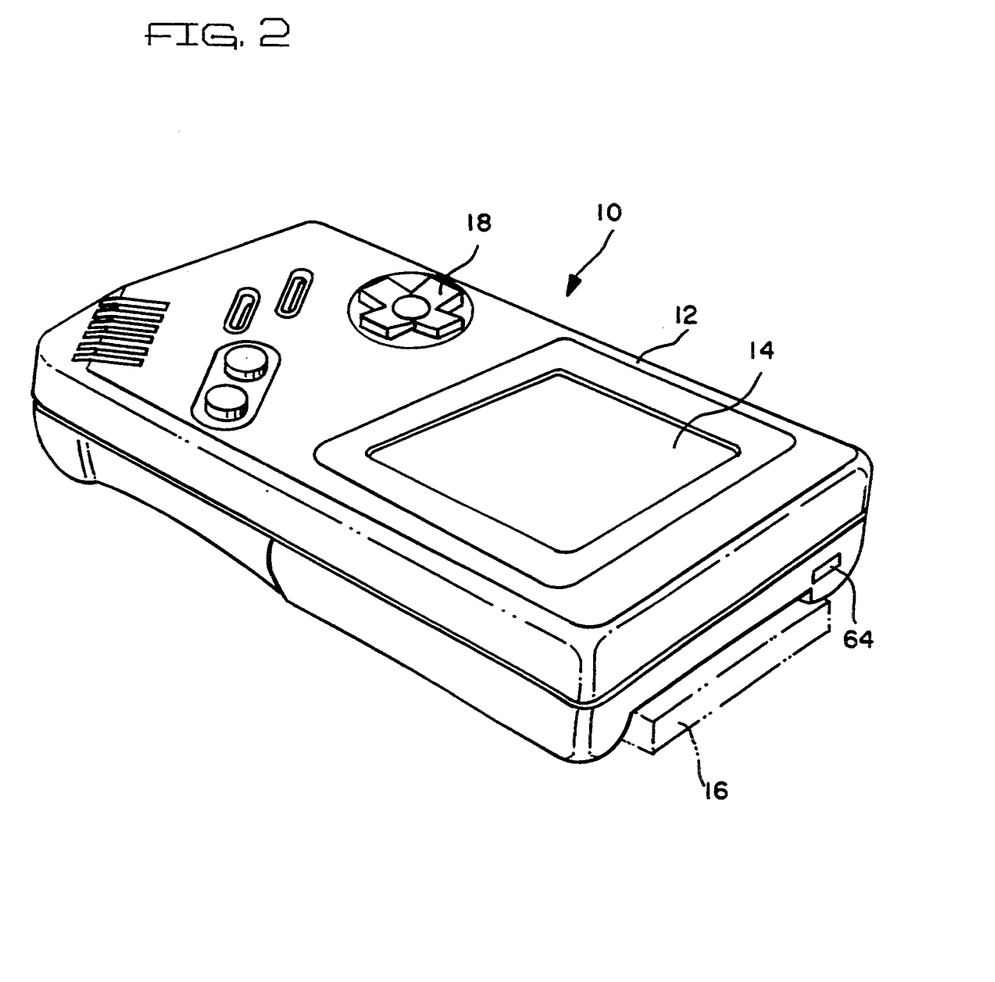
FIG. 2 is a perspective view showing one example of a gaming apparatus to which the present invention is applicable.

FIG. 2 is a perspective view showing one example of a hand-held liquid crystal gaming apparatus to which the present invention is applicable. However, it is pointed out in advance that the present invention is applicable to such a hand-held liquid crystal gaming apparatus as well as any other memory cartridge which is loaded into a main unit in an attachable/detachable manner and incorporates a RAM backed-up by a back-up battery.

This hand-held liquid crystal gaming apparatus (hereinafter, simply called as "gaming apparatus") 10 includes a body 12 which includes on an upper surface thereof a liquid crystal display (LCD) panel 14 in which display segments are arranged in accordance with a dot-matrix system.

On a rear surface of the body 12, an insertion port (not shown) is formed at an upper portion, and a memory cartridge 16 is inserted thereto in an attachable/detachable manner as shown by a dotted line in FIG. 2. Then, a program ROM is incorporated in the memory cartridge 16, and game program data is stored in the program ROM in advance. Therefore, when the memory cartridge 16 is loaded to the body 12 of the gaming apparatus 10, the game program is executed and an image for a game can be displayed on the LCD panel 14.

A cross-key switch 18 for moving a game character on the LCD panel 14 is provided on the upper surface of the body 12. The cross-key switch has four direction designating portions, and by depressing any one of them, it is possible to move the game character up, down, left, or right.

Figure 3:
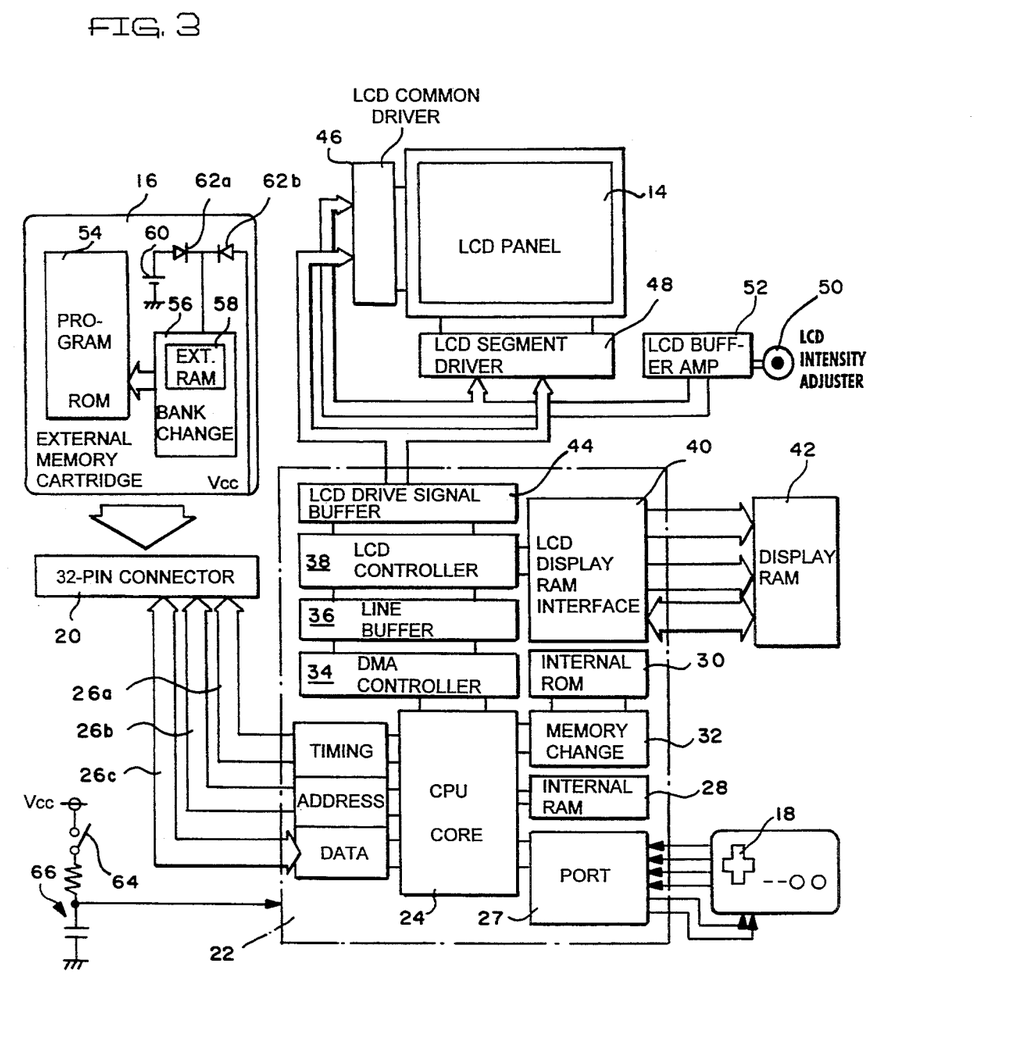
FIG. 3 is a block diagram showing a detailed structure of the FIG. 2 embodiment.

With reference to FIG. 3, the above described memory cartridge 16 is connected to a CPU 22 housed in the body 12 by a 32-pin connector 20. The CPU 22 includes a CPU core 24 (including conventional hardware such as an arithmetic logic unit, associated registers, etc.) which is connected to the 32-pin connector 20 via a control bus 26a, an address bus 26b, and a data bus 26c. Therefore, when the memory cartridge 16 is loaded, the CPU core 24 and the memory cartridge 16 are connected to each other.

The cross-key switch 18 and other switches shown in FIG. 2 are connected to the CPU core 24 through a port 27. In association with the CPU core 24, an internal RAM (working RAM) 28 and an internal ROM 30 are provided. The internal ROM 30 is accessed by the CPU core 24 only when the ROM 30 is selected by a memory changing circuit 32.

The CPU core 24 outputs display data to an LCD controller 38 through a line buffer 36 under the control of a direct memory access (DMA) controller 34. Then, the LCD controller 38 is connected to a display RAM 42 via an LCD display RAM interface 40. Although not shown, the display RAM 42 includes a character RAM and a video RAM (VRAM). Therefore, the LCD controller 38 converts the display data outputted from the CPU core 24 into an LCD drive signal which is output from the display RAM 42. More specifically, the display data from the CPU core 24 designates addresses of the character RAM and the VRAM so that a character (or object) signal and a background signal can be output therefrom, and respective signals are mixed with each other by the LCD controller 39 so as to generate the LCD drive signal.

Then, the LCD drive signal is applied to an LCD common driver 46 and an LCD segment driver 48 through an LCD drive signal buffer 44. Accordingly, an image in accordance with the display data from the CPU core 24 can be displayed on the LCD panel 14 by the LCD common driver 46 and the LCD segment driver 48. In addition, an LCD intensity adjuster 50 is connected to an LCD buffer amplifier 52. By operating the LCD intensity adjuster 50, it is possible to adjust the light intensity on the LCD panel 14.

As described above, the memory cartridge 16 in accordance with the present invention is loaded into the data processing apparatus, i.e. CPU 22, in an attachable/detachable manner. The memory cartridge 16 includes a program ROM 54 which stores program data for operating the CPU core 24 of the CPU 22. The program ROM 54 has a memory area of two mega bits, for example. The memory cartridge 16 further includes a bank changing circuit 56 for switching between banks of the program ROM 54 (shown in FIG. 4), and an external RAM 58 is included in the bank changing circuit 56. However, the external RAM 58 may be provided separately from the bank changing circuit 56.

A back-up power source is applied to the bank changing circuit 56, i.e. the external RAM 58 from a battery 60 such as a lithium battery. A voltage from the battery 60 is applied to the external RAM 58 through a forward direction switch, i.e., diode 62a. However, the external RAM 58 is further supplied with a voltage Vcc from the body through a forward direction switch, i.e., diode 62b. Therefore, the voltage of the battery 60 is applied to the external RAM 58 only when the power source voltage Vcc from the body is less than a reverse bias voltage of the diode 62a.

The control bus 26a, address bus 26b and data bus 26c, being connected to the CPU core 24, are connected to the program ROM 54 and the bank changing circuit 56 of the memory cartridge 16 through the connector 20.

In addition, in association with the CPU 22, as shown in FIGS. 2 and 3, the body 12 is provided with a power source switch 64 through which the power source voltage Vcc is applied. A reset circuit 66 is connected to the voltage source Vcc and, when the power source voltage Vcc through the reset circuit 66 is less than a predetermined level, the CPU core 24 outputs a reset signal so as to disable all the circuits. When the voltage from the reset circuit 66, i.e. the power source voltage Vcc, reaches the predetermined level, the CPU core 24 releases such a reset state so as to enable all the circuits.

Figure 4:
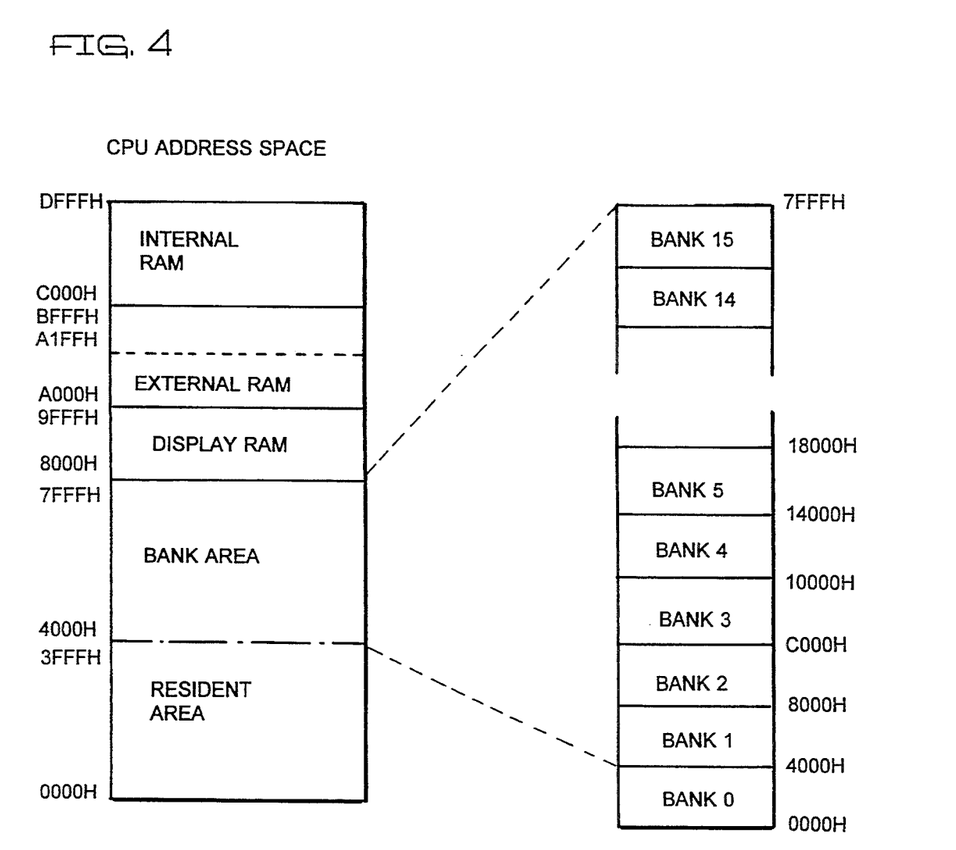
FIG. 4 is a memory map showing an address space of a CPU core shown in FIG. 3.

An address space of the CPU core 24 is from the address "0000H" to the address "DFFFH" as shown in FIG. 4. It is noted that "H" is representative of a hexadecimal number. The addresses "0000H–7FFFH" are assigned for the program ROM 54 of the memory cartridge 16. The addresses "8000H–9FFFH" are assigned for the display RAM 42, addresses "A000H–BFFFH" are assigned for the external RAM 58, and addresses "C000H–DFFFH" are assigned for the internal RAM 30. In this embodiment shown, since the external RAM 58 is 2048 bits (=512×4 bits), practically, the address space "A000H–A1FFH" of the CPU core 24 is used for the external RAM 58.

In addition, since the program ROM 54 is 2M bits (=16 k bytes×16) as described above, 16 banks in total from the bank 0 to the bank 15 are suitably selected by the bank changing circuit 56 to be used. In addition, the addresses "0000H–3FFFH" for the program ROM 54 are a so-called home bank which is used as a resident area.

Figure 1:
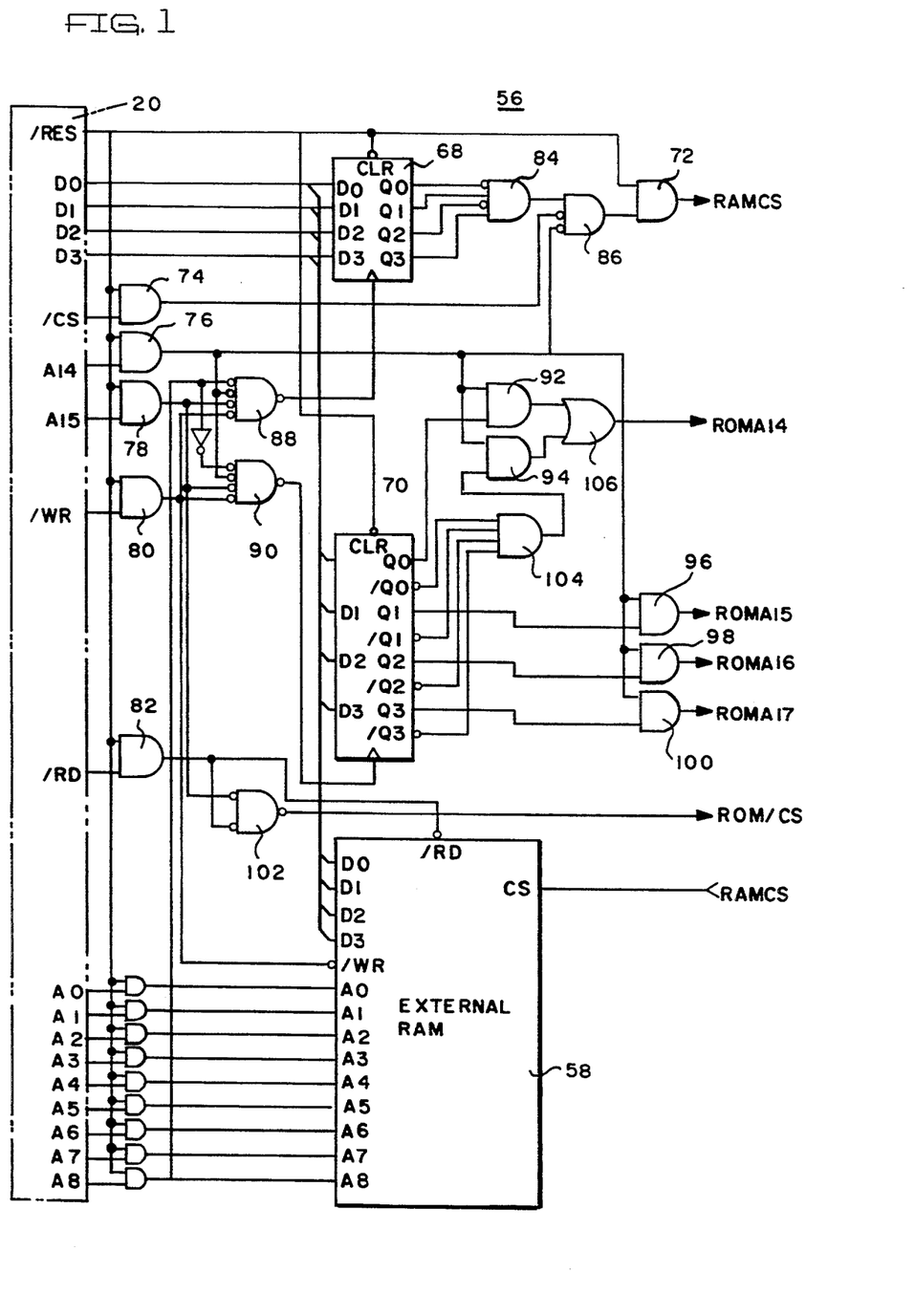
FIG. 1 is a circuit diagram showing a bank changing circuit of one embodiment in accordance with the present invention.

With reference to FIG. 1, the bank changing circuit 56 includes the external RAM 56, as described above. Address bits A0–A8 of the address bus 26b of the CPU core 24 are connected to address inputs A0–A8 of the external RAM 58 through the connector 20. However, the address data is applied to the external RAM 58 through an AND gate only when a reset signal /RES ("/" is a symbol representative of an inverted or complementary signal, and so forth on) is "1". As described above, the reset signal /RES is "0" until the voltage from the reset circuit 6, that is, the power source voltage Vcc, reaches a predetermined level and becomes "1" during a voltage stable period (T3 in FIG. 7).

The above described reset signal IRES is further applied as a clear input of a first register (Reg0) 68, a clear input of a second register (Reg1) 70 and respective first inputs of AND gates 72–82. The lower 4 bits D0–D3 of the data bus 26c of the above described CPU core 24 is given to respective data inputs D0–D3 of the first register 68, second register 70 and the external RAM 58 through the connector 20. The first register 68 is a register for storing or holding multi-bit "key data" from the program ROM 54 and the second register 70 is a register for storing the bank selection data for the program ROM 54.

Outputs Q0-Q3 of the first register 68 are applied to a 4-input AND gate 84 as respective inputs thereof. The AND gate 84 serves as a key detecting circuit for detecting the presence or absence of key data received from first register 68 and outputting key detection signals accordingly. The outputs Q0 and Q2 are inverted before being applied to the AND gate 84 AND gates 86 and 72 function as a control circuit for enabling the RAM 58 in response to various signals. An output of the AND gate 84 and the inverted outputs of the AND gates 74 and 76 are applied to a 3-input AND gate 86. An output of the AND gate 86 is applied to the other input of the AND gate 72 which outputs a RAM selection signal RAMCS. To the other input of the AND gate 74, a chip select signal /CS from the CPU core 24 is applied via the connector 20. The chip select signal /CS is output from the CPU core 24 when the CPU core 24 accesses the external RAM 58.

The upper 2 bits A14 and A15 of the address bus 26b of the CPU core 24 are respectively applied to respective other inputs of the above described AND gates 76 and 78 through the connector 20. Respective outputs of these AND gates 76 and 78 are inverted and applied to NAND gates 88 and 90, each having 4 inputs, as respective inputs thereof. The output of the AND gate 76 is further applied to respective inputs of AND gates 92-100. The output of the AND gate 78 is inverted to be further applied to one input of a NAND gate 102.

A write signal /WR from the CPU core 24 is applied to the other input of the AND gate 80 via the connector 20, and a read signal /RD from the CPU core 24 is applied to the AND gate 82 via the connector 20. An output of the AND gate 80 is inverted and applied to the NAND gates 88 and 90 as respective inputs thereof, and to the external RAM 58 as a write signal /WR. Furthermore, an output of the AND gate 82 is inverted and applied to the other input of the above described NAND gate 102, an output of which becomes a selection signal ROM/CS for selecting the program ROM 54. An output of NAND gate 88 is applied to the first register 68 as a clock or latch input thereof, and an output of the NAND gate 90 is applied to the second register 70 as a clock input thereof.

Inverted outputs /Q0-/Q3 of the second register 70 are applied to respective inputs of a 4-input AND gate 104. An output of the AND gate 104 is applied to the other input of AND gate 94. The output Q0 from the second register 70 is applied to the other input of the AND gate 92. Outputs of these AND gates 92 and 94 are input to an OR gate 106 which produces an address bit ROMA14 for the program ROM 54. The outputs Q1, Q2 and Q3 of the second register 70 are applied to other inputs of the AND gates 96, 98 and 100. Respective outputs of the AND gates 94, 98 and 100 provide address bits ROMA15, ROMA16 and ROMA17 for the program ROM 54. Therefore, these AND gates 96-100 generate addresses greater than address "4000H" of the resident area of the program ROM 54, that is, designation data of the bank 0-bank 15.

Figure 5:
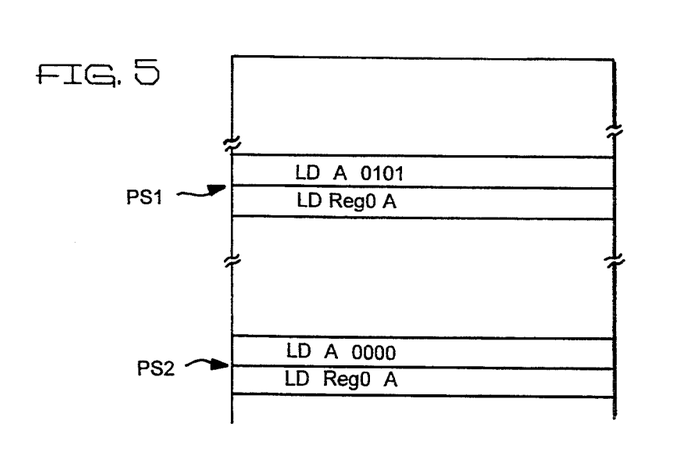
FIG. 5 is an illustrative view showing a portion of a program ROM.

As shown in FIG. 5, the program ROM 54 includes a program step PS1 for storing a program for opening the "lock" (RAM access is permitted) to the external RAM 58, and a program step PS2 for storing a program for closing the lock (preventing RAM access). The program step PS1 includes instructions, for example, LDA0101 (load data "0101" to an accumulator) and LDReg0A (load data of the accumulator to Reg0, i.e. the first register 68). The program step PS2 includes programs, for example, LDA0000 (load data "0000" to the accumulator) and LDReg0A (load data of the accumulator to Reg0, i.e. the first register 68).

Therefore, when the program step PS1 of the program ROM 54 is executed, first key data "0101" is loaded to the data inputs D0-D3. Therefore, when the first register 68 receives a clock or latch signal from the NAND gate 88, the data "0101" is loaded into the first register 68 and the output of the AND gate 84 becomes "1". Since the CPU core 24 outputs the chip select signal /CS for the external RAM 58 at this time, when the address bit A14 becomes "0", that is, when the change from the internal RAM 28 to the external RAM 58 is effected, a "1" is output from AND gate 86 and applied to the AND gate 72. The reset signal /RES is applied to the other input of the AND gate 72. The reset signal is "0" when the power source voltage Vcc is unstable and "1" when the power source voltage Vcc is stable. The AND gate 72 applies a chip select signal RAMCS to the external RAM when the power source voltage becomes stable. Thus, the first key data for "opening" the lock, i.e. generating the RAM chip select signal RAMCS, is loaded into the first register 68 from the program ROM 54, and the external RAM 58 is selected only when the power source voltage becomes stable. Of course, any predetermined data other than "0101" can be utilized as first key data.

When the program step PS2 of the program stored in ROM 54 is executed, data "0000", which may be considered "second key data", is stored in the first register 68. Therefore, the output of the AND gate 84 is "0" and, in response thereto, the output of the AND gate 86 also becomes "0", and the output of the AND gate 72, i.e. the external RAM selection signal RAMCS is held as "0". Accordingly, after the program step PS2 of the program ROM 54 is executed, it becomes impossible to access the external RAM 58. Thus, the program step PS2 "closes the lock" of the external RAM 58. In addition, predetermined data other than "0000" may be utilized as the second key data for closing the lock.

Figure 6:
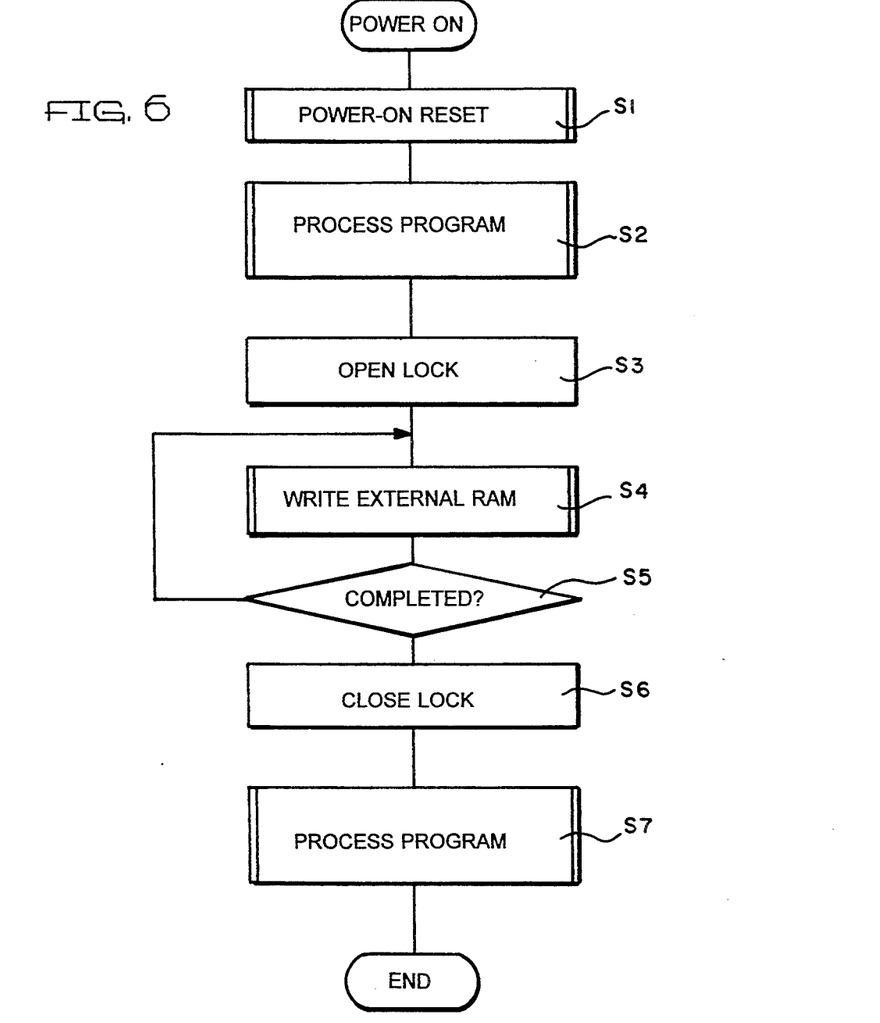
FIG. 6 is a flowchart showing an operation of the present invention in one embodiment.

With reference to FIG. 6, when the power source switch 64 (FIG. 2 and FIG. 3) is turned-on, the CPU core 24 causes a power-on reset state in step S1 until an output voltage from the reset circuit 66 reaches a predetermined level. Then, in step S2, the program stored in program ROM 54 is executed to perform suitable data processing based upon the program.

In step S3, the program step PS1 described previously is executed to open the lock of the external RAM 58. In step S4, the CPU core 24 writes data to the external RAM 58 and, when the completion of writing is detected in step S5, the CPU core 24 executes the program step PS2 described previously, whereby the lock of the external RAM 58 is closed in step 6. Thereafter, in step S7, another program is executed, and the process is terminated by turning the power source switch 64 off. Thus, the CPU core 24 opens and closes the lock of the external RAM 58 by executing the program step PS1, i.e. step S3, and program step SP2, i.e. step S6, of the program ROM 54, and during only that period, it is possible to access to the external RAM 58 to write or read data.

The present invention is applicable not only to a gaming apparatus as set forth in the above described embodiment but also to other data processing apparatus using external memories having an external RAM which is backed-up by a battery.

Although the present invention as been described and illustrated in detail, it is clearly understood that the same is by way of illustration and example only and is not to be taken by way of limitation, the spirit and scope of the present invention being limited only by the terms of the appended claims.

What is claimed is:

1. A memory cartridge removably attachable to a data processing apparatus, said memory cartridge comprising:
    a random access memory (RAM) for storing data generated by said data processing apparatus;
    a read only memory (ROM) for storing a program executable by said data processing apparatus and for storing first multi-bit key data for allowing said data processing apparatus to access said RAM;
    holding means for receiving and holding multi-bit key data read from said ROM by said data processing apparatus in accordance with said program;
    key detecting means for generating a first key detection signal when said multi-bit key data read from said ROM and held in said holding means corresponds to said first multi-bit key data; and
    a control circuit for generating a RAM selection signal for enabling said RAM in response to said first key detection signal and a power detection signal.

2. A memory cartridge in accordance with claim 1, wherein said ROM further stores second multi-bit key data for inhibiting said data processing apparatus from accessing said RAM, and
    said key detecting means generates a second key detection signal when multi-bit key data read from said ROM and held in said holding means corresponds to said second key data and
    said control circuit inhibits generation of said RAM selection signal to prevent access to said RAM when said second key detection signal is generated by said key detecting means.

3. A memory cartridge in accordance with claim 1, wherein said control circuit generates said RAM selection signal in response to a ROM selection signal from said data processing apparatus in an inactive state in addition to said first key detection signal and said power detection signal in an active state.

4. A memory cartridge in accordance with claim 3, wherein when said data processing apparatus generates a write signal and the RAM selection signal is generated, writing of data into said RAM is enabled.

5. A memory cartridge in accordance with claim 4, wherein when said data processing apparatus further generates a read signal and the RAM selection signal is generated, reading of data from said RAM is enabled.

6. A memory cartridge in accordance with claim 4, wherein said data processing apparatus generates said power detection signal when a voltage to be supplied to said data processing apparatus reaches a predetermined voltage level after a power source is activated.

7. A memory cartridge removably attachable to a data processing apparatus which generates write and read signals, address signals, and execution data for executing a desired program, comprising:
    data input terminals for receiving data supplied from said data processing apparatus;
    address input terminals for receiving the address signals supplied from said data processing apparatus;
    a random access memory (RAM) having data inputs connected to said data input terminals and address inputs connected to said address input terminals;
    a read only memory (ROM) for storing said program and first multi-bit key data for allowing said data processing apparatus to access said RAM;
    holding means, connected to said data input terminals, for holding multi-bit key data read from said ROM by said data processing apparatus in accordance with said execution data;
    key detecting means for generating a first key detection signal when said first multi-bit key data read from said ROM and held in said holding means corresponds to said first key data; and
    a control circuit for generating a detection output signal in response to an inactive ROM selection signal, a power detection signal, and said first key detection signal, wherein writing of data into said RAM is enabled in response to said detection output signal and a write signal.

8. A memory cartridge in accordance with claim 7, wherein said ROM further stores second multi-bit key data for inhibiting said data processing apparatus from accessing said RAM,
    said key detecting means generates a second key detection signal when data held in said holding means corresponds to said second multi-bit key data, and
    said control circuit disables said RAM in response to said second key detection signal.

9. A memory cartridge in accordance with claim 7, wherein said data processing apparatus generates said power detection signal when a voltage to be supplied to said data processing apparatus reaches a predetermined voltage level.

10. A memory cartridge in accordance with claim 7, wherein said memory cartridge is supplied with power from said data processing apparatus upon loading, said memory cartridge further comprising:
    a battery for supplying back-up power to said RAM;
    a first switch for supplying power to said external RAM from said data processing apparatus; and
    a second switch for supplying power from said battery to said RAM when power is not supplied from said data processing apparatus.

11. A memory cartridge in accordance with claim 7, wherein reading of data from said RAM is enabled in response to said detection output signal and a read signal.

12. A memory cartridge in accordance with claim 11, wherein reading of data from said RAM is inhibited when said detection output signal is inactive and reading of data from said ROM is enabled in response at least to said ROM selection signal and said read signal.

13. A memory cartridge in accordance with claim 7, wherein said address input terminals are connected to a plurality of address lines, said ROM is configured with a plurality of memory banks, each bank addressable by said address lines, and said address signals are applied to lower significant bit address lines and bank selection data are applied to upper significant bit address lines.

14. A memory cartridge in accordance with claim 13, wherein said bank selection data are stored in said ROM and are read from said ROM by said data processing apparatus and output to said bank selection data storage means.

15. A memory cartridge removably attachable to a data processing apparatus, comprising:
- a random access memory (RAM) for storing data generated by said data processing apparatus;
- a read only memory (ROM) for storing program instructions executable by said data processing apparatus, first multi-bit key data for allowing said data processing apparatus to access said RAM, and second multi-bit key data for preventing said data processing apparatus from accessing said RAM;
- a register for holding key data read from said ROM by said data processing apparatus in accordance with said program instructions;
- a key detector for generating a first key detection signal when said key data read from said ROM and held in said register corresponds to said first multi-bit key data and a second key detection signal when said key data read from said ROM and held in said register corresponds to said second multi-bit key data;
- a control circuit for enabling said RAM at least in part in response to said first key detection signal to permit said data processing apparatus to write data into said RAM and for disabling said RAM in response to said second key detection signal.

16. A memory cartridge in accordance with claim 15, wherein said first key data is applied to said register from said ROM before said data processing apparatus writes data into said RAM, and said second key data is applied to said register from said ROM after completion of writing of data into said RAM by said data processing apparatus.

17. A memory cartridge according to claim 15, wherein said control circuit enables said RAM at least in part in response to said first key detection signal and a ROM selection signal from said data processing apparatus in an active state.

18. A memory cartridge according to claim 15, wherein said control circuit enables said RAM at least in part in response to a signal representative of a voltage level of a power source voltage supplied to the data processing apparatus.

* * * * *